(12) United States Patent
Choi

(10) Patent No.: US 9,236,007 B2
(45) Date of Patent: Jan. 12, 2016

(54) ORGANIC LIGHT-EMITTING DISPLAY DEVICE

(71) Applicant: Samsung Display Co., Ltd., Yongin (KR)

(72) Inventor: Jung Mi Choi, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 191 days.

(21) Appl. No.: 14/035,771

(22) Filed: Sep. 24, 2013

(65) Prior Publication Data

US 2014/0145586 A1    May 29, 2014

(30) Foreign Application Priority Data

Nov. 28, 2012   (KR) .................... 10-2012-0136309

(51) Int. Cl.
*H01J 1/62*      (2006.01)
*H01J 63/04*     (2006.01)
*G09G 3/32*      (2006.01)
*H01L 27/32*     (2006.01)

(52) U.S. Cl.
CPC .......... *G09G 3/3208* (2013.01); *H01L 27/3213* (2013.01); *G09G 2300/0452* (2013.01); *H01L 27/322* (2013.01); *H01L 27/3216* (2013.01)

(58) Field of Classification Search
CPC . G09G 3/3208; G09G 3/3216; G09G 3/3275; G09G 2300/0452; H01L 27/3213; H01L 27/322; H01L 27/3216

USPC ................ 313/504, 512; 428/690; 445/24, 25
See application file for complete search history.

(56) References Cited

U.S. PATENT DOCUMENTS

| 6,867,549 | B2 * | 3/2005 | Cok .................... G09G 3/3216 |
| | | | 315/169.3 |
| 2007/0268286 | A1 * | 11/2007 | Tanada et al. .................. 345/211 |
| 2008/0124997 | A1 * | 5/2008 | Park et al. ........................ 445/25 |
| 2008/0225206 | A1 * | 9/2008 | Satou et al. ..................... 349/68 |
| 2010/0007270 | A1 * | 1/2010 | Suh .............................. 313/504 |
| 2012/0056531 | A1 * | 3/2012 | Park et al. ..................... 313/506 |
| 2013/0002118 | A1 * | 1/2013 | Ko ....................... H01L 27/3216 |
| | | | 313/1 |

FOREIGN PATENT DOCUMENTS

| KR | 10-2008-0048878 A | 6/2008 |
| KR | 10-2010-0069337 A | 6/2010 |
| KR | 10-2011-0026786 A | 3/2011 |

* cited by examiner

*Primary Examiner* — Anh Mai
*Assistant Examiner* — Glenn Zimmerman
(74) *Attorney, Agent, or Firm* — Knobbe Martens Olson & Bear LLP

(57) ABSTRACT

An organic light-emitting display device comprising first through third pixels emitting light of first through third colors, respectively and a fourth pixel comprising first through third subpixels which emit light of the first through third colors, respectively, is disclosed.

19 Claims, 5 Drawing Sheets

ORGANIC LIGHT-EMITTING DISPLAY
DEVICE

CROSS-REFERENCE TO RELATED
APPLICATIONS

This application claims priority from Korean Patent Application No. 10-2012-0136309 filed on Nov. 28, 2012 in the Korean Intellectual Property Office, the disclosure of which is incorporated herein by reference in its entirety.

BACKGROUND

1. Field

The disclosed technology relates to an organic light-emitting display device, and more particularly, to an organic light-emitting display device which can adjust white balance.

2. Description of the Related Technology

As portable display devices (such as notebooks, mobile phones and portable media players (PMPs)) as well as display devices for homes (such as TVs and monitors) become lighter and thinner, various flat panel display technologies are being widely used. A flat panel display device includes a display panel for displaying an image and is the type of technology used can be classified as a liquid crystal display (LCD), an organic light-emitting diode (OELD) display, or an electrophoretic display, for example.

An organic light-emitting display includes a plurality of pixels, and each of the pixels includes a first electrode, a second electrode, and an organic layer formed between the first electrode and the second electrode. The organic layer emits light at a luminance level corresponding to an electric current flowing between the first electrode and the second electrode. The organic light-emitting display generates a desired image by controlling the electric current flowing between the first electrode and the second electrode.

As the performance of the organic layer degrades over time, its light emission efficiency tapers off. Degradation often results from corrosion of the organic layer due to the introduction of oxygen and moisture from the environment, a change in the structure of the organic layer due to electrical stress acting on the organic layer, or the crystallization of a material in the organic layer due to a temperature change.

Generally, the composition of the organic layer included in each pixel (also called a subpixel when an individual color is to be identified) varies according to the color of the pixel. The thickness and area of the organic layer included in each pixel may also vary according to the color of the pixel. Therefore, the organic layer can degrade at varying degrees according to the color of the pixel. This variance according to color changes often changes the color tone of pixels and the entire display, particularly, the white balance of the organic light-emitting display will change over time.

SUMMARY OF CERTAIN INVENTIVE ASPECTS

Aspects of the disclosed technology relate to an organic light-emitting display device which can easily adjust white balance.

Aspects of the disclosed technology also relate to an organic light-emitting display device which can easily compensate for a change in white balance resulting from degradation of an organic layer.

However, aspects of the disclosed technology are not restricted to the one set forth herein. The above and other aspects of the disclosed technology will become more apparent to one of ordinary skill in the art to which the disclosed technology pertains by referencing the detailed description of the disclosed technology given below.

According to an aspect of the disclosed technology, an organic light-emitting display device comprising, first through third pixels emitting light of first through third colors, respectively and a fourth pixel comprising first through third subpixels which emit light of the first through third colors, respectively.

The first through third colors are red, green, and blue, respectively.

The first through third subpixels have a smaller area than the first through third pixels, respectively.

The first through third subpixels can be controlled independently from gray levels of the first through third pixels.

The first through third subpixels are the same size.

The third subpixel is larger than the first subpixel and the second subpixel.

The first through third pixels comprise organic layers emitting light of the first through third colors, respectively.

The first through third pixels comprise organic layers emitting white light and first through third color filters of the first through third colors, respectively.

The fourth pixel functions as a white pixel.

The gray level of the first subpixel corresponds to the gray level of the first pixel, the gray level of the second subpixel corresponds to the gray level of the second pixel, and the gray level of the third subpixel corresponds to the gray level of the third pixel.

According to another aspect of the disclosed technology, an organic light-emitting display device comprising a substrate comprising first through fourth pixel areas, a first electrode formed on the substrate, an organic layer formed on the first electrode and emitting light of one of first through third colors and a second electrode formed on the organic layer, wherein the fourth pixel area comprises first through third subpixel areas, and the first electrode, the organic layer, and the second electrode are formed on each of the first through third pixel areas and the first through third subpixel areas.

The organic layer of the first pixel area and the organic layer of the first subpixel area emit light of the first color, the organic layer of the second pixel area and the organic layer of the second subpixel area emit light of the second color, and the organic layer of the third pixel area and the organic layer of the third subpixel area emit light of the third color.

The first subpixel area is smaller than the first pixel area, the second subpixel area is smaller than the second pixel area, and the third subpixel area is smaller than the third pixel area.

The third subpixel area is larger than the first pixel area and the second pixel area.

The first through third colors are red, green, and blue, respectively.

According to another aspect of the disclosed technology, an organic light-emitting display device comprising, a substrate comprising first through fourth pixel areas, a first electrode formed on the substrate, an organic layer formed on the first electrode and emitting white light, a second electrode formed on the organic layer and a color filter formed on a path of light emitted from the organic layer and having one of first through third colors, wherein the fourth pixel area comprises first through third subpixel areas, and the first electrode, the organic layer, and the second electrode are formed on each of the first through third pixel areas and the first through third subpixel areas.

The first subpixel area is smaller than the first pixel area, the second subpixel area is smaller than the second pixel area, and the third subpixel area is smaller than the third pixel area.

The first electrode is a transparent electrode, the second electrode is a reflective electrode, and the color filter is formed under the first electrode.

The color filter is formed under the substrate.

The first electrode is a reflective electrode, the second electrode is a transparent electrode, and the color filter is formed on the second electrode.

BRIEF DESCRIPTION OF THE DRAWINGS

The above and other aspects and features of the disclosed technology will become more apparent by describing in detail exemplary embodiments thereof with reference to the attached drawings, in which.

DETAILED DESCRIPTION OF CERTAIN INVENTIVE EMBODIMENTS

Figure 1:
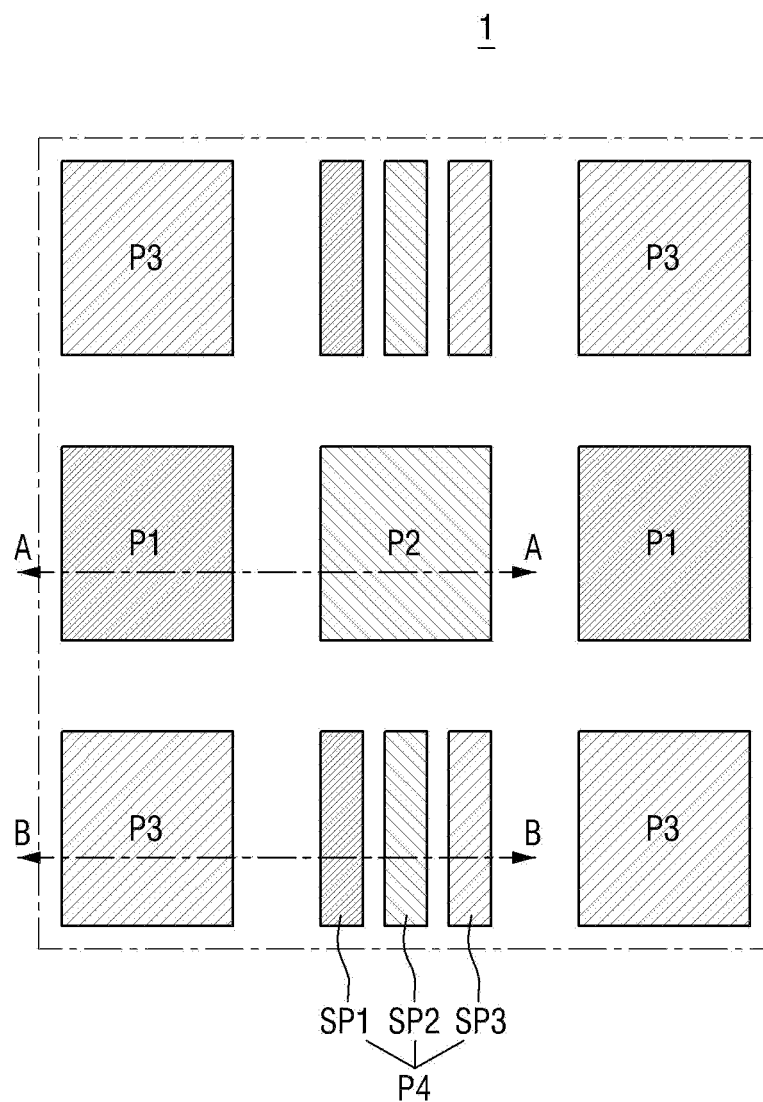
FIG. 1 is a schematic plan view of a portion of a panel of an organic light-emitting display device according to an embodiment of the disclosed technology.

Advantages and features of the disclosed technology and methods of accomplishing the same may be understood more readily by reference to the following detailed description of preferred embodiments and the accompanying drawings. The disclosed technology may, however, be embodied in many different forms and should not be construed as being limited to the embodiments set forth herein. Rather, these embodiments are provided so that this disclosure will be thorough and complete and will fully convey the concept of the invention to those skilled in the art, and the disclosed technology will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the disclosed technology.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments of the disclosed technology will now be described with reference to the attached drawings.

FIG. 1 is a schematic plan view of a portion of the panel containing a matrix of pixels in an organic light-emitting display device 1 according to an embodiment of the disclosed technology.

Referring to the embodiment of FIG. 1, the organic light-emitting display device 1 includes first through fourth pixels P1 through P4 that are arranged in a matrix. The first through third pixels P1 through P3 emit light of first through third colors, respectively. For example, the first color may be red, the second color may be green, and the third color may be blue. The arrangement of the first through fourth pixels P1 through P4 shown in FIG. 1 is merely an example and can be modified in various ways. For example, positions of the first through fourth pixels P1 through P4 in FIG. 1 may be swapped with each other. Alternatively, the first through fourth pixels P1 through P4 may be arranged in a row. Alternatively, the first through fourth pixels P1 through P4 may not be arranged in a matrix.

The fourth pixel P4 typically includes first through third subpixels SP1 through SP3. The first subpixel SP1 emits light of the first color, the second subpixel SP2 emits light of the second color, and the third subpixel SP3 emits light of the third color. In one embodiment, the first subpixel SP1 is smaller than the first pixel P1, the second subpixel SP2 is smaller than the second pixel P2, and the third subpixel SP3 is smaller than the third pixel P3. The first through third subpixels SP1 through SP3 may be, but are not limited to, the same size. Gray levels of the first through third subpixels SP1 through SP3 may be controlled independently from gray levels of the first through third pixels P1 through P3. In some embodiments, the fourth pixel P4 emits light corresponding to a mode of the organic light-emitting display device 1.

When the organic light-emitting display device 1 is in a first mode, the first through third subpixels SP1 through SP3 included in the fourth pixel P4 may emit light at gray levels corresponding to the gray levels of the first through third pixels P1 through P3, respectively. For example, the first subpixel SP1 may emit light at a gray level corresponding to the gray level of the first pixel P1, the second subpixel SP2 may emit light at a gray level corresponding to the gray level of the second pixel P2, and the third subpixel SP3 may emit light at a gray level corresponding to the gray level of the third pixel P3. In this case, substantially the same the effect can be obtained as when a light-emitting area of the first through third pixels P1 through P3 increases. Thus, the aperture ratio of the organic light-emitting display device 1 increases.

The first subpixel SP1 may be implemented to emit light at the same gray level as the first pixel P1, the second subpixel SP2 may be implemented to emit light at the same gray level as the second pixel P2, and the third subpixel SP3 may be implemented to emit light at the same gray level as the third pixel P3. In this case, the first through third subpixels SP1 through SP3 do not affect white balance of the organic light-emitting display device 1.

The first through third subpixels SP1 through SP3 may be controlled to emit light at gray levels corresponding to the gray levels of the first through third pixels P1 through P3 but different from the gray levels of the first through third pixels P1 through P3, respectively. For example, the first subpixel SP1 may emit light at a gray level a predetermined percentage higher or lower than a gray level of light emitted from the first pixel P1. The second subpixel SP2 and the third subpixel SP3 may operate in the same way as the first subpixel SP1. The organic light-emitting display device 1 can adjust its white balance by controlling a ratio of the gray level of the first subpixel SP1 to the gray level of the first pixel P1, a ratio of the gray level of the second subpixel SP2 to the gray level of the second pixel P2, and a ratio of the gray level of the third subpixel SP3 to the gray level of the third pixel P3. Therefore, when the white balance is changed by the degradation of an organic layer included in the organic light-emitting display device 1, the organic light-emitting display device 1 can compensate for the changed white balance by controlling the aforementioned ratios.

When the organic light-emitting display device 1 is in a second mode, it can operate as a pentile RGBW display, and the fourth pixel P4 functions as a white pixel. The fourth pixel P4 functioning as a white pixel can easily increase the luminance of the organic light-emitting display device 1. The first through third subpixels SP1 through SP3 may be controlled to emit light such that a mixture of the emitted light is seen as white light. The gray levels of the first through third subpixels SP1 through SP3 may vary according to the gray levels of the first through third pixels P1 through P3 adjacent to the first through third subpixels SP1 through SP3.

When the organic light-emitting display device 1 is in the second mode, the ratio of the gray levels of the first through third subpixels SP1 through SP3 can be adjusted. That is, the ratio of the gray level of the first subpixel SP1 to the gray level of the second subpixel SP2 to the gray level of the third subpixel SP3 are adjusted, and the white balance of the organic light-emitting display device 1 is adjusted accordingly. Therefore, when the white balance is changed due to the degradation of the organic layer included in the organic light-emitting display device 1, the organic light-emitting display device 1 can compensate for the changed white balance by adjusting the ratio of the gray levels of the first through third subpixels SP1 through SP3.

Figure 2:
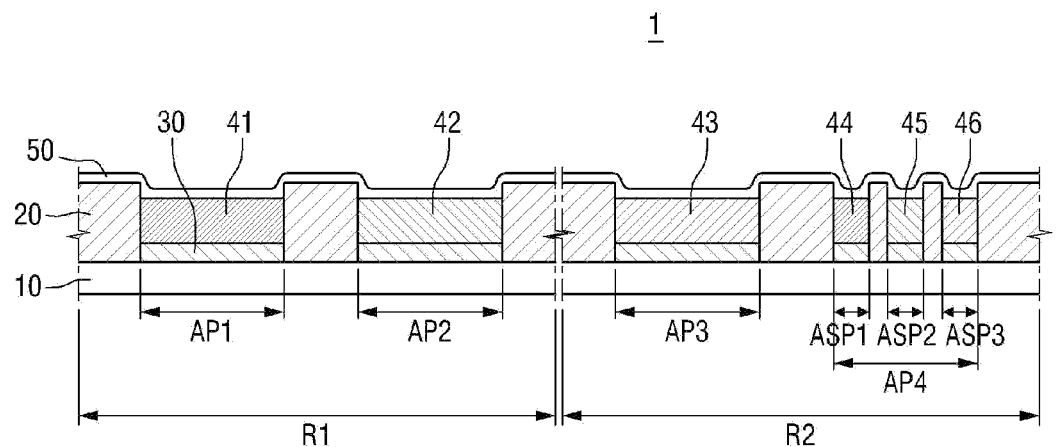
FIG. 2 is a cross-sectional view of the organic light-emitting display device taken along the lines A-A and B-B of FIG. 1.

The internal structure of the organic light-emitting display device 1 shown in FIG. 1 will now be described in more detail with reference to FIG. 2. FIG. 2 is a cross-sectional view of the organic light-emitting display device 1 taken along the lines A-A and B-B of FIG. 1. In FIG. 2, a first region R1 is a cross-section taken along the line A-A of FIG. 1, and a second region R2 is a cross-section taken along the line B-B of FIG. 1.

Referring to FIG. 2, the depicted embodiment of the organic light-emitting display device 1 includes a substrate 10, first electrodes 30, organic light-emitting layers 41 through 46, and a second electrode 50.

The substrate 10 may support other components of the organic light-emitting display device 1. Although not shown in the drawing, the substrate 10 typically has wirings and thin-film transistors formed thereon for driving the first through fourth pixels P1 through P4. In the as depicted embodiment, the substrate 10 includes first through fourth pixel areas AP1 through AP4. The first pixel P1 is formed on the first pixel area AP1, the second pixel P2 is formed on the second pixel area AP2, the third pixel P3 is formed on the third pixel area AP3, and the fourth pixel P4 is formed on the fourth pixel area AP4. The fourth pixel area AP4 includes first through third subpixel areas ASP1 through ASP3. The first subpixel SP1 is formed on the first subpixel area ASP1, the second subpixel SP2 is formed on the second subpixel area ASP2, and the third subpixel SP3 is formed on the third subpixel area ASP3.

The first electrodes 30 are formed on the substrate 10. In operation, a voltage or current will be applied to each of the first electrodes 30 in the first through fourth pixel areas AP1 through AP4 so as to control the light emitted from each of the first through fourth pixel areas AP1 through AP4. Furthermore, a voltage or current will be applied to each of the first electrodes 30 in the first through third subpixel areas ASP1 through ASP3 so as to control the light emitted from each of the first through third subpixel areas ASP1 through ASP3. The first electrodes 30 may be transparent electrodes. If the first electrodes 30 are transparent electrodes, the second electrode 50 may be a reflective electrode, and the substrate 10 may be made of a transparent material. If the first electrodes 30 are transparent electrodes, the organic light-emitting display device 1 may operate as a bottom emission display device which emits light from the organic layers 41 through 46 through a bottom of the substrate 10. According to some embodiments, if the first electrodes 30 are reflective electrodes, the second electrode 50 may be a transparent electrode. If the first electrodes 30 are reflective electrodes, the organic light-emitting display device 1 may operate as a top emission display device which emits light from the organic layers 41 through 46 through the second electrode 50.

The organic layers 41 through 46 are formed on the first electrodes 10, and each of the organic layers 41 through 46 emits light at a gray level corresponding to an electric current flowing therethrough. The electric current flowing through each of the organic layers 41 through 46 will be controlled by the voltage or electric current applied to each of the first electrodes 30 and the second electrode 50. The organic layer 41 formed in the first pixel area AP1, the organic layer 42 formed in the second pixel area AP2, the organic layer 43 formed in the third pixel area AP3 emit light of different colors. For example, the organic layer 41 formed in the first pixel area AP1 emits light of the first color, the organic layer 42 formed in the second pixel area AP2 emits light of the second color, and the organic layer 43 formed in the third pixel area AP3 emits light of the third color. Likewise, the organic layer 44 formed in the first subpixel area ASP1, the organic layer 45 formed in the second subpixel area ASP2, and the organic layer 46 formed in the third subpixel area ASP3 emit light of different colors. For example, the organic layer 44 formed in the first subpixel area ASP1 emits light of the first color, the organic layer 45 formed in the second subpixel area ASP2 emits light of the second color, and the organic layer 43 formed in the third subpixel area ASP3 emits light of the third color.

The second electrode 50 is formed on the organic layers 41 through 46. The second electrode 50 may be formed on the whole surface of the organic light-emitting display device 1. However, the disclosed technology is not limited thereto. The second electrode 50 may be a reflective electrode. According to some embodiments, if the first electrodes 30 are reflective electrodes, the second electrode 50 may be a transparent electrode.

The organic light-emitting display device 1 may further include a pixel defined layer 20. The pixel defined layer 20 may be formed on the substrate 10. The first through fourth pixel areas AP1 through AP4 and the first through third subpixel areas ASP1 through ASP3 may be defined by areas in which the pixel defined layer 20 is not formed on the substrate 10.

Figure 3:
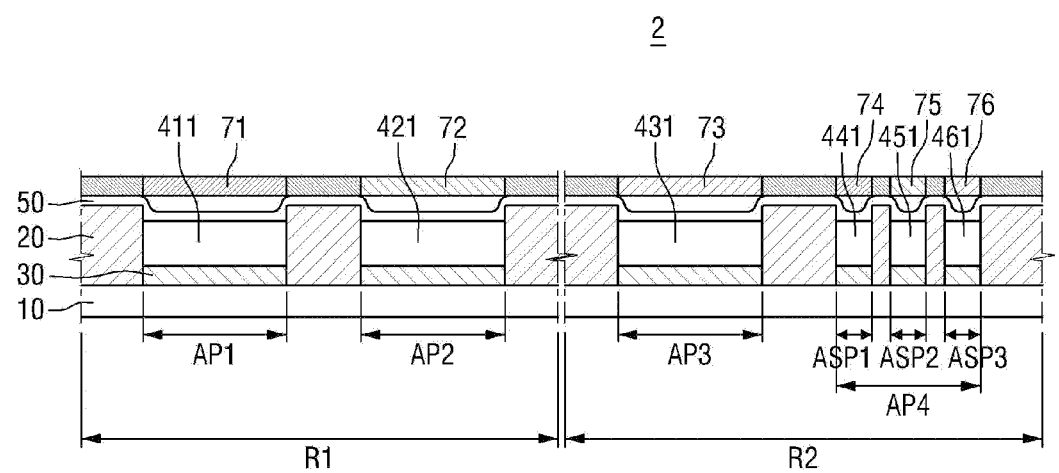
FIG. 3 is a cross-sectional view of an organic light-emitting display device according to another embodiment of the disclosed technology.

An organic light-emitting display device according to another embodiment of the disclosed technology will now be described with reference to FIG. 3. FIG. 3 is a cross-sectional view of an organic light-emitting display device 2 according to another embodiment of the disclosed technology. A plan view of the panel portion of the organic light-emitting display device 2 is substantially identical to that shown in FIG. 1. In FIG. 3, a first region R1 corresponds to a cross-section taken along the line A-A of FIG. 1, and a second region R2 corresponds to a cross-section taken along the line B-B of FIG. 1.

Referring to FIG. 3, the depicted embodiment of the organic light-emitting display device 2 includes a substrate 10, first electrodes 30, organic layers 411 through 461, a second electrode 50, and color filters 71 through 76.

The organic layers 411 through 461 included in first through third pixel areas AP1 through AP3 and first through third subpixel areas ASP1 through ASP3 emit light of the same color. For example, the organic layers 411 through 461 emit white light.

The color filters 71 through 76 are formed on the second electrode 50. The color filters 71 and 74 included in the first pixel area SP1 and the first subpixel area ASP1 are color filters of a first color, the color filters 72 and 75 included in the second pixel area SP2 and the second subpixel area ASP2 are color filters of a second color, and the color filters 73 and 76 included in the third pixel area SP3 and the third subpixel area ASP3 are color filters of a third color.

The first electrodes 30 may be reflective electrodes, and the second electrode 50 may be a transparent electrode. Therefore, light generated by the organic layers 411 through 461 may travel to above the second electrode 50 and pass through the color filters 71 through 76 to be seen outside.

Other components of the organic light-emitting display device 2 which are substantially identical to those of the organic light-emitting display device 1 of FIG. 2 are indicated by like reference numerals, and thus their description will be omitted.

Figure 4:
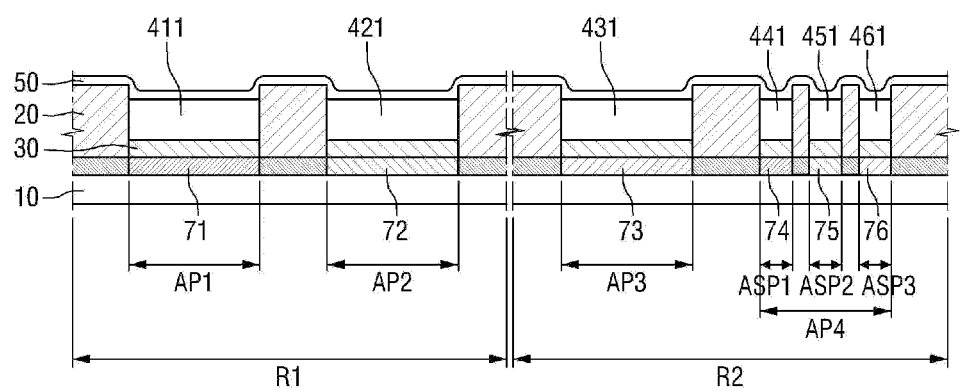
FIG. 4 is a cross-sectional view of an organic light-emitting display device according to another embodiment of the disclosed technology.

An organic light-emitting display device according to another embodiment of the disclosed technology will now be described with reference to FIG. 4. FIG. 4 is a cross-sectional view of an organic light-emitting display device 3 according to another embodiment of the disclosed technology. A plan view of the panel portion of the organic light-emitting display device 3 is substantially identical to that shown in FIG. 1. In FIG. 4, a first region R1 corresponds to a cross-section taken along the line A-A of FIG. 1, and a second region R2 corresponds to a cross-section taken along the line B-B of FIG. 1.

Referring to FIG. 4, the depicted embodiment of the organic light-emitting display device 3 includes a substrate 10, first electrodes 30, organic layers 411 through 461, a second electrode 50, and color filters 71 through 76.

The color filters 71 through 76 are interposed between the first electrodes 30 and the substrate 10.

The first electrodes 30 may be transparent electrodes, and the second electrode 50 may be a reflective electrode. Therefore, light generated by the organic layers 411 through 461 may travel to under the first electrodes 30 and pass through the color filters 71 through 76 and the substrate 10 to be seen outside.

Other components of the organic light-emitting display device 3 which are substantially identical to those of the organic light-emitting display devices 1 and 2 of FIGS. 2 and 3 are indicated by like reference numerals, and thus their description will be omitted.

Figure 5:
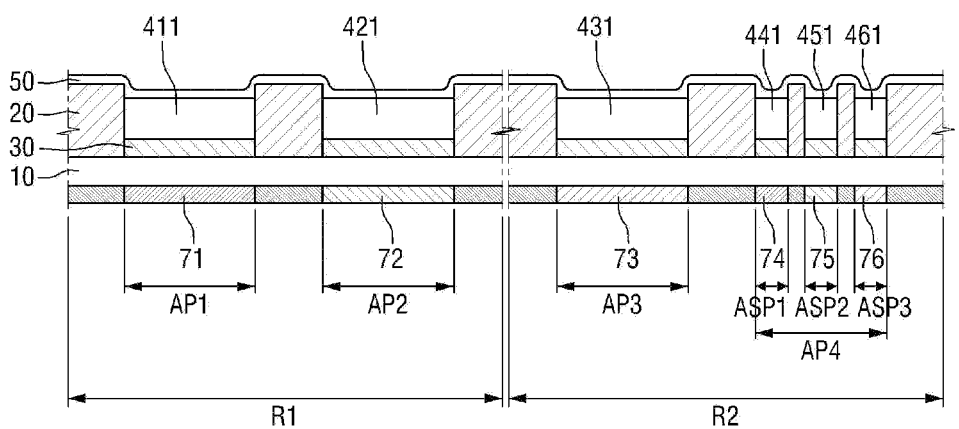
FIG. 5 is a cross-sectional view of an organic light-emitting display device according to another embodiment of the disclosed technology.

An organic light-emitting display device according to another embodiment of the disclosed technology will now be described with reference to FIG. 5. FIG. 5 is a cross-sectional view of an organic light-emitting display device 4 according to another embodiment of the disclosed technology. A plan view of the panel portion of the organic light-emitting display device 4 is substantially identical to that shown in FIG. 1. In FIG. 5, a first region R1 corresponds to a cross-section taken along the line A-A of FIG. 1, and a second region R2 corresponds to a cross-section taken along the line B-B of FIG. 1.

Referring to FIG. 5, the depicted embodiment of the organic light-emitting display device 4 includes a substrate 10, first electrodes 30, organic layers 411 through 461, a second electrode 50, and color filters 71 through 76.

The color filters 71 through 76 are formed under the substrate 10.

The first electrodes 30 may be transparent electrodes, and the second electrode 50 may be a reflective electrode. Therefore, light generated by the organic layers 411 through 461 may travel to under the first electrodes 30 and pass through the substrate 10 and the color filters 71 through 76 to be seen outside.

Other components of the organic light-emitting display device 4 which are substantially identical to those of the organic light-emitting display devices 1 and 2 of FIGS. 2 and 3 are indicated by like reference numerals, and thus their description will be omitted.

An organic light-emitting display device according to another embodiment of the disclosed technology will now be described with reference to FIG. 6.

Figure 6:
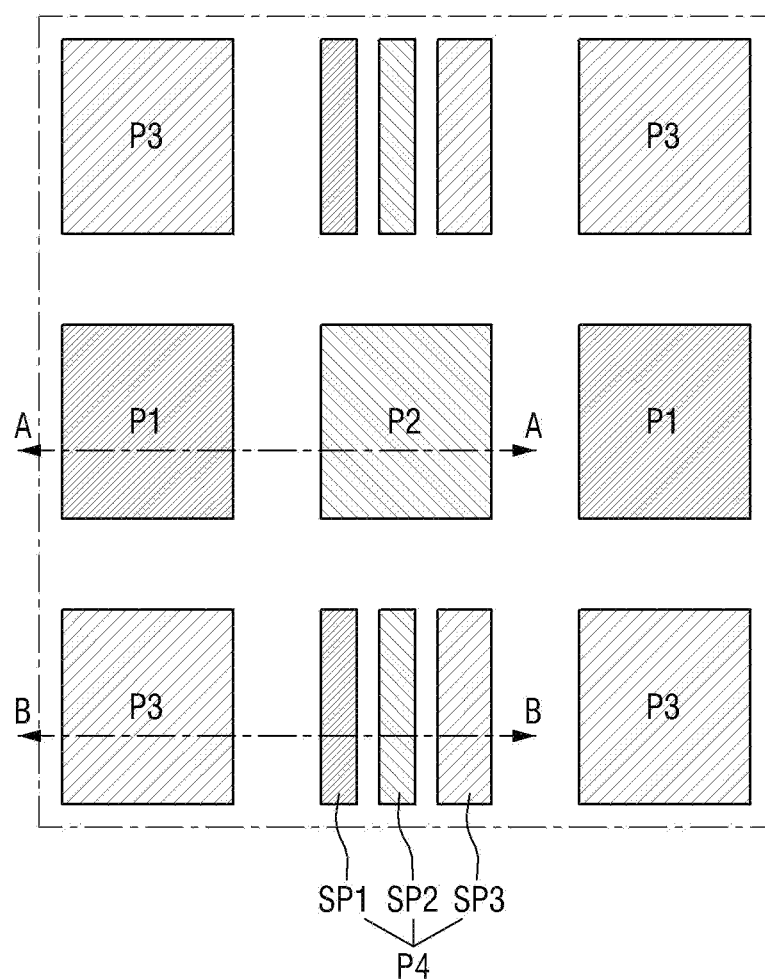
FIG. 6 is a schematic plan view of a portion of a panel of an organic light-emitting display device according to another embodiment of the disclosed technology.

FIG. 6 is a schematic plan view of a portion of the panel containing a matrix of pixels in an organic light-emitting display device 5 according to another embodiment of the disclosed technology.

Referring to FIG. 6, the organic light-emitting display device 5 includes first through fourth pixels P1 through P4. The fourth pixel P4 includes first through third subpixels SP1 through SP3. As depicted, the first through third subpixels SP1 through SP3 have different sizes. For example, the third subpixel SP3 may be larger than the first subpixel SP1 and the second subpixel SP2. In the circumstance, where the organic layer emitting light of a third color degrades faster than an organic layer emitting light of a first color or a second color, if the third subpixel SP3 emitting light of the third color is larger than the first subpixel SP1 and the second subpixel SP2, the size of an organic layer included in the third subpixel SP3 can be increased. This can slow down the degradation of the organic layer included in the third subpixel SP3, thereby extending the life of the third subpixel SP3. The life of the organic light-emitting display device 5 can be determined by the life of a pixel that degrades fastest. Therefore, the extension of the life of the third subpixel SP3 which deteriorates fastest from among the first through third subpixels SP1 through SP3 can lead to the extension of the life of the organic light-emitting display device 5. In FIG. 5, the first subpixel SP1 and the second subpixel SP2 are the same size. However, of the first subpixel SP1 and the second subpixel SP2, a subpixel including an organic layer with a relatively short life span may be formed larger than the other subpixel. Indeed, all subpixels SP1-SP3, may have different sized areas according to the implementation and design needs.

Other components of the organic light-emitting display device 5 which are substantially identical to those of the organic light-emitting display device 1 of FIG. 1 are indicated by like reference numerals, and thus their description will be omitted.

Figure 7:
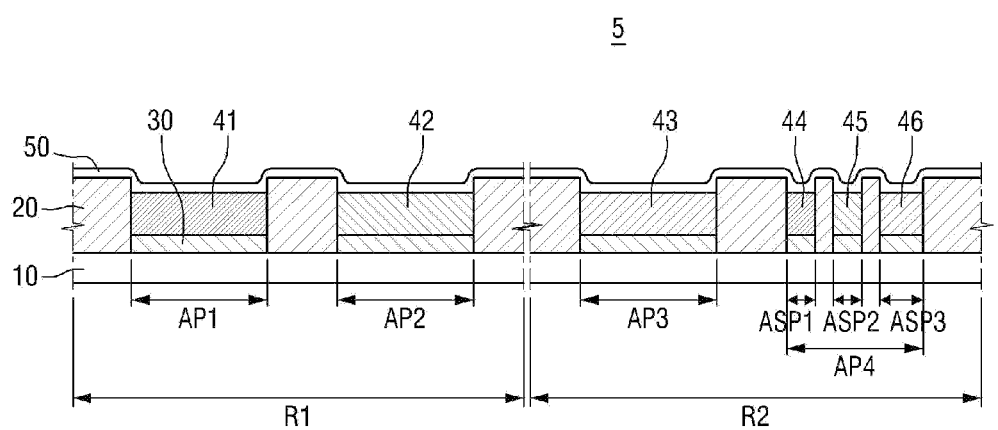
FIG. 7 is a cross-sectional view of the organic light-emitting display device taken along the lines A-A and B-B of FIG. 6.

The internal structure of the organic light-emitting display device 5 shown in FIG. 6 will now be described in more detail with reference to FIG. 7. FIG. 7 is a cross-sectional view of the organic light-emitting display device 5 taken along the lines A-A and B-B of FIG. 6. In FIG. 7, a first region R1 is a cross-section taken along the line A-A of FIG. 6, and a second region R2 is a cross-section taken along the line B-B of FIG. 6.

Referring to FIG. 7, the depicted embodiment of the organic light-emitting display device 5 includes a substrate 10, first electrodes 30, organic light-emitting layers 41 through 46, and a second electrode 50.

The substrate 10 includes first through fourth pixel areas AP1 through AP4, and the fourth pixel area AP4 includes first through third subpixel areas ASP1 through ASP3. The third subpixel area ASP3 is larger than the first subpixel area ASP1 and the second subpixel area ASP2. If the third subpixel area ASP3 is larger than the first subpixel area ASP1 and the second subpixel area ASP2, the organic layer 46 included in the third subpixel area ASP3 may be larger than the organic layer 44 included in the first subpixel area ASP1 and the organic layer 45 included in the second subpixel area ASP2. If the organic layer 46 included in the third subpixel area ASP3 is larger than the organic layers 44 and 45 included in the first and second subpixel areas ASP1 and ASP2, the degradation of the organic layer 46 included in the third subpixel area ASP3 may be slowed, thereby extending the life of the organic light-emitting display device 5.

Other components of the organic light-emitting display device 5 which are substantially identical to those of the organic light-emitting display device 1 of FIG. 2 are indicated by like reference numerals, and thus their description will be omitted.

At least some embodiments of the disclosed technology provide at least one of the following advantages.

The white balance of an organic light-emitting display device can be adjusted easily.

In addition, it is possible to easily compensate for a change in the white balance of the organic light-emitting display device resulting from degradation of an organic layer.

Furthermore, the life of the organic light-emitting display device can be extended.

However, the effects of the disclosed technology are not restricted to the ones set forth herein. Furthermore, while embodiments have been disclosed, it is the claims that provide the scope of inventive aspects. The above and other effects of the disclosed technology will become more apparent to one of relevant skill in the technology to which the disclosed technology pertains by referencing the claims.

What is claimed is:

1. An organic light-emitting display device, comprising:
a first pixel emitting light of only a first color;
a second pixel emitting light of a second color;
a third pixel emitting light of a third color; and
a fourth pixel comprising a first subpixel emitting light of only the first color, a second subpixel emitting light of the second color, and a third subpixel emitting light of the third color,
wherein the first subpixel has a smaller area than the first pixel.

2. The display device of claim 1, wherein the first through third colors are red, green, and blue, respectively.

3. The display device of claim 1, wherein each of the second subpixel and the third subpixel has a smaller area than each of the second pixel and the third pixel, respectively.

4. The display device of claim 1, wherein gray levels of the first through third subpixels can be controlled independently from gray levels of the first through third pixels.

5. The display device of claim 1, wherein the first through third subpixels are the same size.

6. The display device of claim 1, wherein the third subpixel is larger than each of the first subpixel and the second subpixel.

7. The display device of claim 1, wherein the first through third pixels comprise organic layers emitting light of the first through third colors, respectively.

8. The display device of claim 1, wherein the first through third pixels comprise organic layers emitting white light and first through third color filters of the first through third colors, respectively.

9. The display device of claim 1, wherein the fourth pixel functions as a white pixel.

10. The display device of claim 1, wherein the gray level of the first subpixel corresponds to the gray level of the first pixel, the gray level of the second subpixel corresponds to the gray level of the second pixel, and the gray level of the third subpixel corresponds to the gray level of the third pixel.

11. An organic light-emitting display device, comprising:
a substrate comprising first through fourth pixel areas;
a first electrode disposed on the substrate;
an organic layer disposed on the first electrode and emitting light of one of first through third colors; and
a second electrode disposed on the organic layer,
wherein the fourth pixel area comprises first through third subpixel areas, and the first electrode, the organic layer, and the second electrode are disposed on each of the first through third pixel areas and the first through third subpixel areas, and wherein the organic layer of the first pixel area and the organic layer of the first subpixel area emit light of only the first color, the organic layer of the second pixel area and the organic layer of the second subpixel area emit light of the second color, and the organic layer of the third pixel area and the organic layer of the third subpixel area emit light of the third color,
wherein the first subpixel area is smaller than the first pixel area.

12. The display device of claim 11, wherein the second subpixel area is smaller than the second pixel area, and the third subpixel area is smaller than the third pixel area.

13. The display device of claim 12, wherein the third subpixel area is larger than each of the first subpixel area and the second subpixel area.

14. The display device of claim 13, wherein the first through third colors are red, green, and blue, respectively.

15. An organic light-emitting display device comprising:
a substrate comprising first through fourth pixel areas;
a first electrode disposed on the substrate;
an organic layer disposed on the first electrode and emitting white light;
a second electrode disposed on the organic layer; and
a color filter disposed on a path of light emitted from the organic layer,
wherein the fourth pixel area comprises first through third subpixel areas, and the first electrode, the organic layer, the second electrode, and the color filter are formed on each of the first through third pixel areas and the first through third subpixel areas, and wherein the color filter included on the first pixel area and the first subpixel area is of only a first color, the color filter included on the second pixel area and the second subpixel area is of a second color, and the color filter included on the third pixel area and the third subpixel area is of a third color, wherein the first subpixel area is smaller than the first pixel area.

16. The display device of claim 15, wherein the second subpixel area is smaller than the second pixel area, and the third subpixel area is smaller than the third pixel area.

17. The display device of claim 15, wherein the first electrode is a transparent electrode, the second electrode is a reflective electrode, and the color filter is formed under the first electrode.

18. The display device of claim 15, wherein the first electrode is a reflective electrode, the second electrode is a transparent electrode, and the color filter is formed on the second electrode.

19. The display device of claim 17, wherein the color filter is formed under the substrate.

* * * * *